(12) United States Patent
Choi et al.

(10) Patent No.: US 11,611,355 B2
(45) Date of Patent: Mar. 21, 2023

(54) TECHNIQUES FOR PARAMETER SET AND HEADER DESIGN FOR COMPRESSED NEURAL NETWORK REPRESENTATION

(71) Applicant: TENCENT AMERICA LLC, Palo Alto, CA (US)

(72) Inventors: Byeongdoo Choi, Palo Alto, CA (US); Wei Wang, Palo Alto, CA (US); Wei Jiang, Sunnyvale, CA (US); Stephan Wenger, Hillsborough, CA (US); Shan Liu, San Jose, CA (US)

(73) Assignee: TENCENT AMERICA LLC, Palo Alto, CA (US)

( * ) Notice: Subject to any disclaimer, the term of this patent is extended or adjusted under 35 U.S.C. 154(b) by 38 days.

(21) Appl. No.: 17/324,623

(22) Filed: May 19, 2021

(65) Prior Publication Data

US 2021/0399739 A1    Dec. 23, 2021

Related U.S. Application Data

(60) Provisional application No. 63/090,131, filed on Oct. 9, 2020, provisional application No. 63/088,304, filed
(Continued)

(51) Int. Cl.
*H03M 7/00* (2006.01)
*H03M 7/30* (2006.01)
*H04L 65/75* (2022.01)

(52) U.S. Cl.
CPC ....... *H03M 7/3059* (2013.01); *H03M 7/6005* (2013.01); *H03M 7/70* (2013.01); *H04L 65/75* (2022.05)

(58) Field of Classification Search
CPC .......... G06T 2207/20084; G06T 9/002; G06T 2207/20021; G06T 2207/20081; G06T 3/4046; G06T 2207/10016; G06T 2207/20024; G06T 2207/20052; G06T 2207/20056; G06T 2207/20064; G06T 2207/20221; H04N 19/44; H04N 19/30; H04N 19/172; H04N 19/167; H04N 19/124; H04N 19/154; H04N 19/159;
(Continued)

(56) References Cited

U.S. PATENT DOCUMENTS 11,429,865 B1 * 8/2022 Patton ................... G06N 3/082
2017/0230675 A1 * 8/2017 Wierstra ................. G06T 9/002
(Continued)

OTHER PUBLICATIONS

International Search Report dated Sep. 15, 2021 in Application No. PCT/US21/36818.
(Continued)

*Primary Examiner* — Linh V Nguyen
(74) *Attorney, Agent, or Firm* — Sughrue Mion, PLLC

(57) ABSTRACT

Systems and methods for encoding and decoding neural network data is provided. A method includes: receiving a neural network representation (NNR) bitstream including a group of NNR units (GON) that represents an independent neural network with a topology, the GON including an NNR model parameter set unit, an NNR layer parameter set unit, an NNR topology unit, an NNR quantization unit, and an NNR compressed data unit; and reconstructing the independent neural network with the topology by decoding the GON.

20 Claims, 5 Drawing Sheets

Related U.S. Application Data on Oct. 6, 2020, provisional application No. 63/047,214, filed on Jul. 1, 2020, provisional application No. 63/042,298, filed on Jun. 22, 2020.

(58) Field of Classification Search
CPC ...... H04N 19/48; H04N 19/42; H04N 19/513; H04N 19/80; H04N 19/82; H04N 19/12; G06N 3/0454; G06N 3/0445; G06N 3/04; G06N 20/00; G06N 3/0472; G06N 20/10; G06N 3/063; G06N 3/084; G06N 3/006; G06N 3/086; G06N 3/0481; G06N 3/088; G06N 3/08; H03M 13/6312
USPC .............................................. 341/51, 87, 107
See application file for complete search history.

(56) References Cited

U.S. PATENT DOCUMENTS

| | | |
|---|---|---|
| 2018/0249158 A1 | 8/2018 | Huang et al. |
| 2019/0034492 A1 | 1/2019 | Sheppard et al. |
| 2019/0122119 A1* | 4/2019 | Husain .................. G06N 3/086 |
| 2019/0273948 A1 | 9/2019 | Yin et al. |
| 2020/0159534 A1 | 5/2020 | Li et al. |
| 2020/0159961 A1 | 5/2020 | Smith et al. |
| 2020/0184603 A1* | 6/2020 | Mukherjee ............. H04N 19/82 |
| 2020/0226717 A1* | 7/2020 | Kim ....................... H04N 19/85 |
| 2021/0192354 A1* | 6/2021 | Patil ..................... G06N 3/0454 |
| 2021/0208236 A1* | 7/2021 | John Wilson ........... G01S 7/003 |
| 2021/0374518 A1* | 12/2021 | Zhu ........................ G06F 9/3877 |
| 2021/0383585 A1* | 12/2021 | Zhao ..................... G06N 3/088 |
| 2022/0055211 A1* | 2/2022 | Wang .................. G06N 3/0454 |
| 2022/0141496 A1* | 5/2022 | Li .......................... H04N 19/85 375/240.26 |

OTHER PUBLICATIONS

Written Opinion of the International Searching Authority dated Sep. 15, 2021 in Application No. PCT/US21/36818.

"Working Draft 4 of Compression of neural networks for multimedia content description and analysis", ISO/IEC JTC 1/SC 29/WG 11 N19225, May 15, 2020, 54 pages.

Extended European Search Report dated Nov. 7, 2022 in European Application No. 21830300.6.

Johan Bartelmess, "Compression efficiency of different picture coding structures in High Efficiency Video Coding (HEVC)", Mar. 2016, pp. 1-46 (49 pages total), Retrieved from the Internet: http://www.diva-portal.org/smash/get/diva2:915989/FULLTEXT01.pdf.

* cited by examiner

TECHNIQUES FOR PARAMETER SET AND HEADER DESIGN FOR COMPRESSED NEURAL NETWORK REPRESENTATION

CROSS-REFERENCE TO THE RELATED APPLICATIONS

This application claims priority from U.S. Provisional Application No. 63/042,298, filed on Jun. 22, 2020; U.S. Provisional Application No. 63/047,214, filed on Jul. 1, 2020; U.S. Provisional Application No. 63/088,304, filed on Oct. 6, 2020; and U.S. Provisional Application No. 63/090,131, filed on Oct. 9, 2020, the disclosures of which are incorporated herein by reference in their entirety.

FIELD

Embodiments of the present disclosure relate to encoding and decoding of neural network data, and more specifically, to parameter set and header design of compressed neural network representation.

BACKGROUND

Encoding and decoding of neural network data is provided.

SUMMARY

Embodiments of the present disclosure include techniques for parameter set and header design for compressed neural network representation.

Embodiments of the present disclosure include techniques for partial and independent unit design for compressed neural network representation.

Embodiments of the present disclosure include techniques for parameter set and aggregate unit design for compressed neural network representation.

One or more embodiments includes a method performed by at least one processor. The method includes: receiving a neural network representation (NNR) bitstream including a group of NNR units (GON) that represents an independent neural network with a topology, the GON including an NNR model parameter set unit, an NNR layer parameter set unit, an NNR topology unit, an NNR quantization unit, and an NNR compressed data unit; and reconstructing the independent neural network with the topology by decoding the GON.

According to an embodiment, the GON is included in one or more aggregate NNR units of the NNR bitstream.

According to an embodiment, the GON is included in a single aggregate NNR unit.

According to an embodiment, the single aggregate NNR unit includes a syntax element that indicates a type of the single aggregate NNR unit as a self-contained NNR aggregate unit.

According to an embodiment, the syntax element is included in a header of the single aggregate NNR unit.

According to an embodiment, the NNR model parameter set unit includes a syntax element that indicates that NNR units, that refer to the NNR model parameter set unit, are independently decodable.

According to an embodiment, the syntax element is included in a header of the NNR model parameter set unit.

According to an embodiment, the NNR layer parameter set unit includes a syntax element that indicates that NNR units, that refer to the NNR layer parameter set unit, are independently decodable.

According to an embodiment, the syntax element is included in a header of the NNR layer parameter set unit.

According to an embodiment, in the GON, the NNR model parameter set unit is followed by the NNR layer parameter set unit.

According to one or more embodiments, a system is provided. The system includes: at least one processor that is configured to receive a neural network representation (NNR) bitstream including a group of NNR units (GON) that represents an independent neural network with a topology, the GON including an NNR model parameter set unit, an NNR layer parameter set unit, an NNR topology unit, an NNR quantization unit, and an NNR compressed data unit; and memory storing computer code, the computer code including reconstructing code configured to cause the at least one processor to reconstruct the independent neural network with the topology by decoding the GON.

According to an embodiment, the GON is included in one or more aggregate NNR units of the NNR bitstream.

According to an embodiment, the GON is included in a single aggregate NNR unit.

According to an embodiment, the single aggregate NNR unit includes a syntax element that indicates a type of the single aggregate NNR unit as a self-contained NNR aggregate unit, and the computer code includes determining code that is configured to determine that the single aggregate NNR unit is self-contained based on the syntax element.

According to an embodiment, the syntax element is included in a header of the single aggregate NNR unit.

According to an embodiment, the NNR model parameter set unit includes a syntax element that indicates that NNR units, that refer to the NNR model parameter set unit, are independently decodable, and the computer code includes determining code that is configured to determine that the NNR units, that refer to the NNR model parameter set unit, are independently decodable based on the syntax element.

According to an embodiment, the syntax element is included in a header of the NNR model parameter set unit.

According to an embodiment, the NNR layer parameter set unit includes a syntax element that indicates that NNR units, that refer to the NNR layer parameter set unit, are independently decodable, and the computer code includes determining code that is configured to determine that the NNR units, that refer to the NNR layer parameter set unit, are independently decodable based on the syntax element.

According to an embodiment, the syntax element is included in a header of the NNR layer parameter set unit.

According to one or more embodiments, a non-transitory computer-readable medium storing computer instructions is provided. The computer instructions, when executed by at least one processor that receives a neural network representation (NNR) bitstream including a group of NNR units (GON) that represents an independent neural network with a topology, cause the at least one processor to: reconstruct the independent neural network with the topology by decoding the GON, wherein the GON includes an NNR model parameter set unit, an NNR layer parameter set unit, an NNR topology unit, an NNR quantization unit, and an NNR compressed data unit.

BRIEF DESCRIPTION OF THE DRAWINGS

Further features, the nature, and various advantages of the disclosed subject matter will be more apparent from the following detailed description and the accompanying drawings in which.

DETAILED DESCRIPTION

Figure 1:
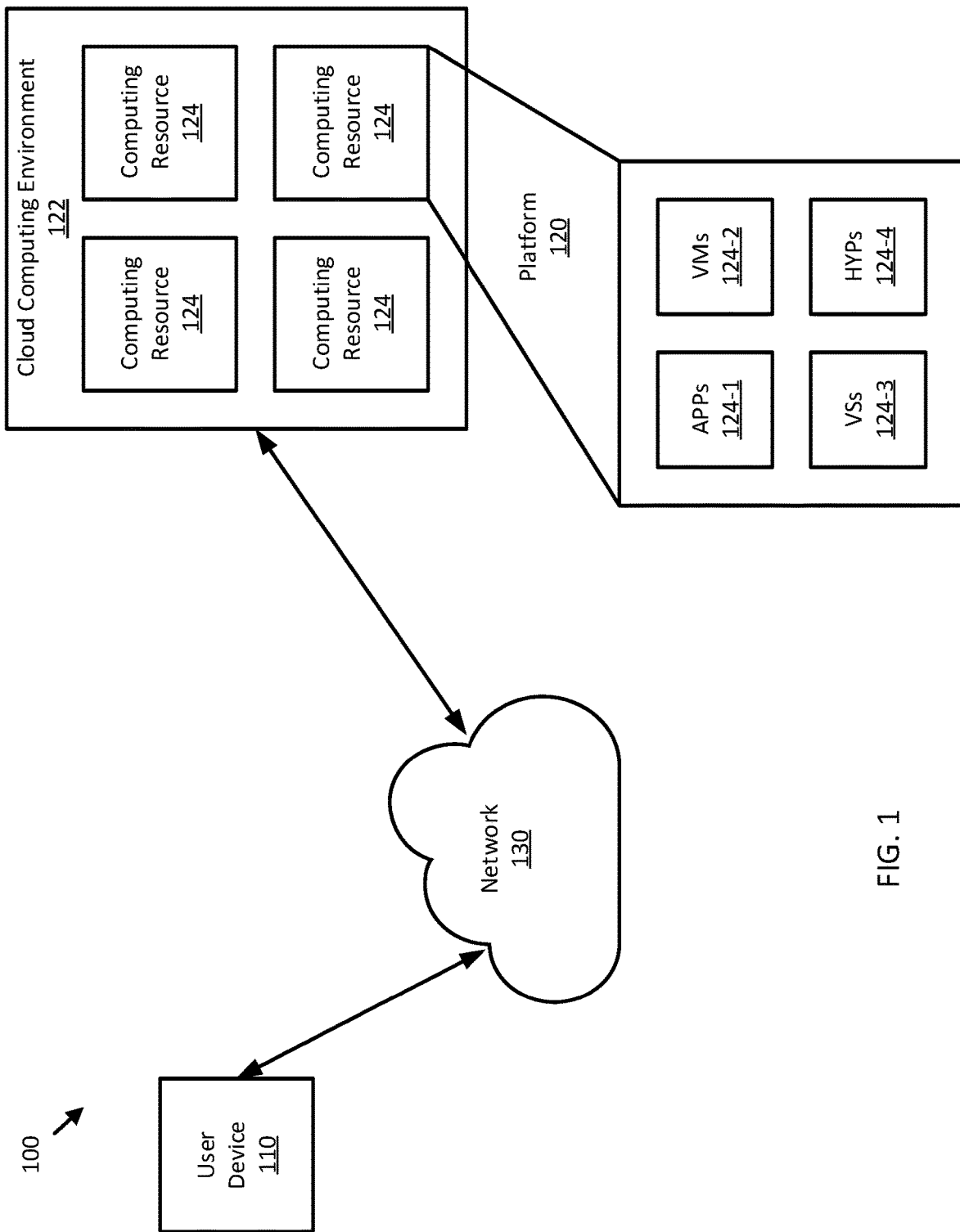
FIG. 1 is a diagram of an environment in which methods, apparatuses, and systems described herein may be implemented, according to embodiments.

FIG. 1 is a diagram of an environment 100 in which methods, apparatuses, and systems described herein may be implemented. As shown in FIG. 1, the environment 100 may include a user device 110, a platform 120, and a network 130. Devices of the environment 100 may interconnect via wired connections, wireless connections, or a combination of wired and wireless connections.

The user device 110 includes one or more devices capable of receiving, generating, storing, processing, and/or providing information associated with platform 120. For example, the user device 110 may include a computing device (e.g. a desktop computer, a laptop computer, a tablet computer, a handheld computer, a smart speaker, a server, etc.), a mobile phone (e.g. a smart phone, a radiotelephone, etc.), a wearable device (e.g. a pair of smart glasses or a smart watch), or a similar device. In some implementations, the user device 110 may receive information from and/or transmit information to the platform 120.

The platform 120 includes one or more devices as described elsewhere herein. In some implementations, the platform 120 may include a cloud server or a group of cloud servers. In some implementations, the platform 120 may be designed to be modular such that software components may be swapped in or out. As such, the platform 120 may be easily and/or quickly reconfigured for different uses.

In some implementations, as shown, the platform 120 may be hosted in a cloud computing environment 122. Notably, while implementations described herein describe the platform 120 as being hosted in the cloud computing environment 122, in some implementations, the platform 120 may not be cloud-based (i.e. may be implemented outside of a cloud computing environment) or may be partially cloud-based.

The cloud computing environment 122 includes an environment that hosts the platform 120. The cloud computing environment 122 may provide computation, software, data access, storage, etc. services that do not require end-user (e.g. the user device 110) knowledge of a physical location and configuration of system(s) and/or device(s) that hosts the platform 120. As shown, the cloud computing environment 122 may include a group of computing resources 124 (referred to collectively as "computing resources 124" and individually as "computing resource 124").

The computing resource 124 includes one or more personal computers, workstation computers, server devices, or other types of computation and/or communication devices. In some implementations, the computing resource 124 may host the platform 120. The cloud resources may include compute instances executing in the computing resource 124, storage devices provided in the computing resource 124, data transfer devices provided by the computing resource 124, etc. In some implementations, the computing resource 124 may communicate with other computing resources 124 via wired connections, wireless connections, or a combination of wired and wireless connections.

As further shown in FIG. 1, the computing resource 124 includes a group of cloud resources, such as one or more applications ("APPs") 124-1, one or more virtual machines ("VMs") 124-2, virtualized storage ("VSs") 124-3, one or more hypervisors ("HYPs") 124-4, or the like.

The application 124-1 includes one or more software applications that may be provided to or accessed by the user device 110 and/or the platform 120. The application 124-1 may eliminate a need to install and execute the software applications on the user device 110. For example, the application 124-1 may include software associated with the platform 120 and/or any other software capable of being provided via the cloud computing environment 122. In some implementations, one application 124-1 may send/receive information to/from one or more other applications 124-1, via the virtual machine 124-2.

The virtual machine 124-2 includes a software implementation of a machine (e.g. a computer) that executes programs like a physical machine. The virtual machine 124-2 may be either a system virtual machine or a process virtual machine, depending upon use and degree of correspondence to any real machine by the virtual machine 124-2. A system virtual machine may provide a complete system platform that supports execution of a complete operating system ("OS"). A process virtual machine may execute a single program, and may support a single process. In some implementations, the virtual machine 124-2 may execute on behalf of a user (e.g. the user device 110), and may manage infrastructure of the cloud computing environment 122, such as data management, synchronization, or long-duration data transfers.

The virtualized storage 124-3 includes one or more storage systems and/or one or more devices that use virtualization techniques within the storage systems or devices of the computing resource 124. In some implementations, within the context of a storage system, types of virtualizations may include block virtualization and file virtualization. Block virtualization may refer to abstraction (or separation) of logical storage from physical storage so that the storage system may be accessed without regard to physical storage or heterogeneous structure. The separation may permit administrators of the storage system flexibility in how the administrators manage storage for end users. File virtualization may eliminate dependencies between data accessed at a file level and a location where files are physically stored. This may enable optimization of storage use, server consolidation, and/or performance of non-disruptive file migrations.

The hypervisor 124-4 may provide hardware virtualization techniques that allow multiple operating systems (e.g. "guest operating systems") to execute concurrently on a host computer, such as the computing resource 124. The hypervisor 124-4 may present a virtual operating platform to the guest operating systems, and may manage the execution of the guest operating systems. Multiple instances of a variety of operating systems may share virtualized hardware resources.

The network 130 includes one or more wired and/or wireless networks. For example, the network 130 may include a cellular network (e.g. a fifth generation (5G) network, a long-term evolution (LTE) network, a third generation (3G) network, a code division multiple access (CDMA) network, etc.), a public land mobile network (PLMN), a local area network (LAN), a wide area network (WAN), a metropolitan area network (MAN), a telephone network (e.g. the Public Switched Telephone Network (PSTN)), a private network, an ad hoc network, an intranet, the Internet, a fiber optic-based network, or the like, and/or a combination of these or other types of networks.

The number and arrangement of devices and networks shown in FIG. 1 are provided as an example. In practice, there may be additional devices and/or networks, fewer devices and/or networks, different devices and/or networks, or differently arranged devices and/or networks than those shown in FIG. 1. Furthermore, two or more devices shown in FIG. 1 may be implemented within a single device, or a single device shown in FIG. 1 may be implemented as multiple, distributed devices. Additionally, or alternatively, a set of devices (e.g. one or more devices) of the environment 100 may perform one or more functions described as being performed by another set of devices of the environment 100.

Figure 2:
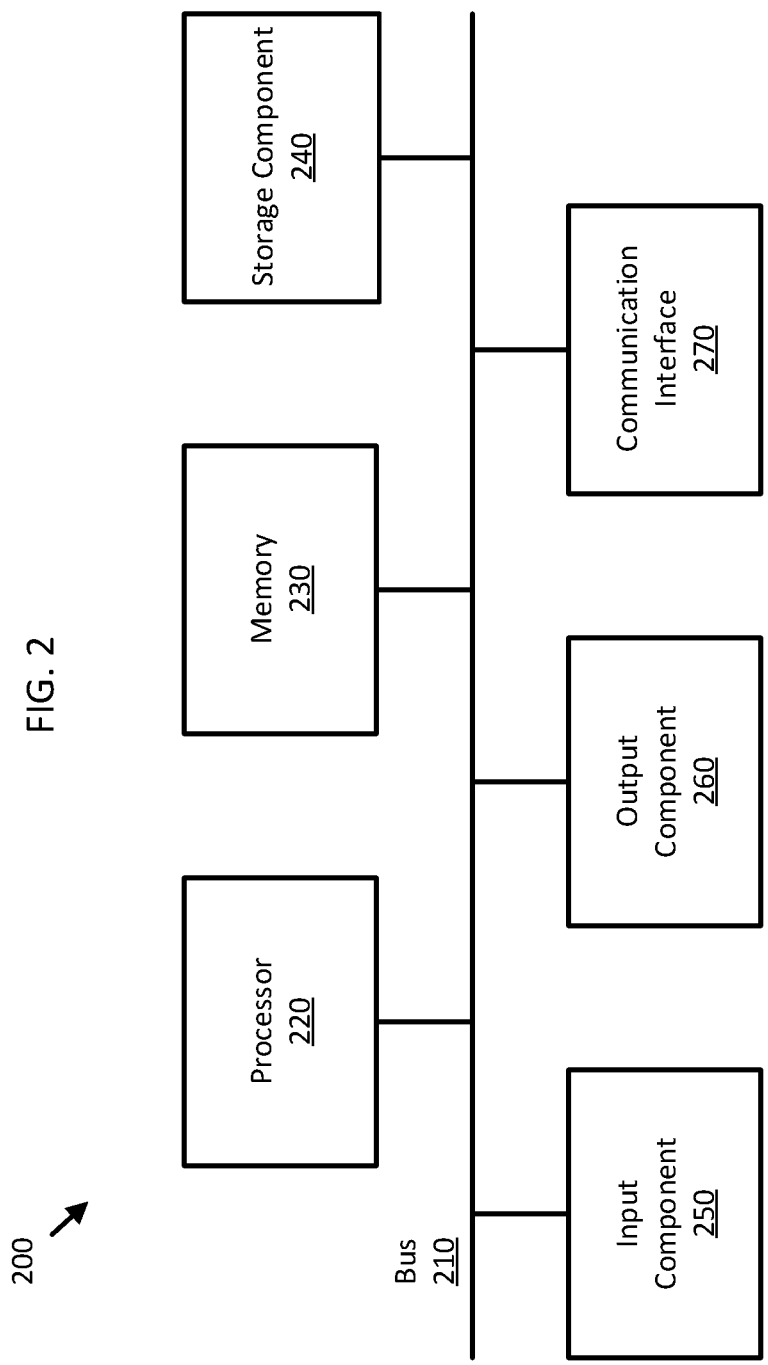
FIG. 2 is a block diagram of example components of one or more devices of FIG. 1.

FIG. 2 is a block diagram of example components of one or more devices of FIG. 1. The device 200 may correspond to the user device 110 and/or the platform 120. As shown in FIG. 2, device 200 may include a bus 210, a processor 220, a memory 230, a storage component 240, an input component 250, an output component 260, and a communication interface 270.

The bus 210 includes a component that permits communication among the components of the device 200. The processor 220 is implemented in hardware, firmware, or a combination of hardware and software. The processor 220 is a central processing unit (CPU), a graphics processing unit (GPU), an accelerated processing unit (APU), a microprocessor, a microcontroller, a digital signal processor (DSP), a field-programmable gate array (FPGA), an application-specific integrated circuit (ASIC), or another type of processing component. In some implementations, the processor 220 includes one or more processors capable of being programmed to perform a function. The memory 230 includes a random access memory (RAM), a read only memory (ROM), and/or another type of dynamic or static storage device (e.g. a flash memory, a magnetic memory, and/or an optical memory) that stores information and/or instructions for use by the processor 220.

The storage component 240 stores information and/or software related to the operation and use of the device 200. For example, the storage component 240 may include a hard disk (e.g. a magnetic disk, an optical disk, a magneto-optic disk, and/or a solid state disk), a compact disc (CD), a digital versatile disc (DVD), a floppy disk, a cartridge, a magnetic tape, and/or another type of non-transitory computer-readable medium, along with a corresponding drive.

The input component 250 includes a component that permits the device 200 to receive information, such as via user input (e.g. a touch screen display, a keyboard, a keypad, a mouse, a button, a switch, and/or a microphone). Additionally, or alternatively, the input component 250 may include a sensor for sensing information (e.g. a global positioning system (GPS) component, an accelerometer, a gyroscope, and/or an actuator). The output component 260 includes a component that provides output information from the device 200 (e.g. a display, a speaker, and/or one or more light-emitting diodes (LEDs)).

The communication interface 270 includes a transceiver-like component (e.g. a transceiver and/or a separate receiver and transmitter) that enables the device 200 to communicate with other devices, such as via a wired connection, a wireless connection, or a combination of wired and wireless connections. The communication interface 270 may permit the device 200 to receive information from another device and/or provide information to another device. For example, the communication interface 270 may include an Ethernet interface, an optical interface, a coaxial interface, an infrared interface, a radio frequency (RF) interface, a universal serial bus (USB) interface, a Wi-Fi interface, a cellular network interface, or the like.

The device 200 may perform one or more processes described herein. The device 200 may perform these processes in response to the processor 220 executing software instructions stored by a non-transitory computer-readable medium, such as the memory 230 and/or the storage component 240. A computer-readable medium is defined herein as a non-transitory memory device. A memory device includes memory space within a single physical storage device or memory space spread across multiple physical storage devices.

Software instructions may be read into the memory 230 and/or the storage component 240 from another computer-readable medium or from another device via the communication interface 270. When executed, software instructions stored in the memory 230 and/or the storage component 240 may cause the processor 220 to perform one or more processes described herein. Additionally, or alternatively, hardwired circuitry may be used in place of or in combination with software instructions to perform one or more processes described herein. Thus, implementations described herein are not limited to any specific combination of hardware circuitry and software.

The number and arrangement of components shown in FIG. 2 are provided as an example. In practice, the device 200 may include additional components, fewer components, different components, or differently arranged components than those shown in FIG. 2. Additionally, or alternatively, a set of components (e.g. one or more components) of the device 200 may perform one or more functions described as being performed by another set of components of the device 200.

Embodiments described below may be implemented by one or more components of the environment 100. For example, the embodiments described below may be implemented by the user device 110 or the platform 120. The embodiments described below may be implemented by at least one processor and memory storing computer instructions. The computer instructions may be configured to cause, when executed by the at least one processor, the functions of the embodiments to be performed. For example, the computer instructions may be configured to cause the at least one processor to implement at least one NNR bitstream as described below, including sending, receiving, and decoding the NNR bitstream.

Embodiments of present disclosure may include the following improvements to parameter sets and headers in NNR HLS:

Aspect 1. Embodiments may add a definition of "group of NNR units (GON)" that is a group of NNR units that comprises an entire or partial neural network with a topology. Each GON is self-contained and independently decodable. In an NNR bitstream, one or multiple GONs may be present. Each GON starts with an NNR model parameter set unit, followed by an NNR layer parameter set, an NNR topology unit, and other NNR units. The concept of GON may be equivalent to the coded video sequence (CVS) in VVC/HEVC/AVC, except the time sequential concept. The GON may not have a sequence order with a count information. Each GON may be contained in one or more aggregate NNR units. Each aggregate NNR unit may include at least one associated model parameter set and one associated layer parameter set, when an aggregate NNR unit represents a partial or entire neural network with a topology. Then, the scopes of the associated model parameter set and the associated layer parameter set may be limited to the NNR units contained in (or associated with) the aggregate NNR unit. In that case, the aggregate NNR unit may have one or more identifiers to indicate the reference parameter(s).

Aspect 2: Embodiments may include syntax elements of a model_parameter_set_id and layer_parameter_set_id, and define the reference rule of NNR model parameter set and layer parameter set and their scope, so that only one model parameter set is referenced by all layer parameter sets in a group of NNR units and a layer parameter set is referenced by one or more NNR units. The concepts of NNR model parameter set and layer parameter set may be equivalent to sequence parameter set and picture parameter set in VVC/HEVC/AVC, respectively. Each aggregate NNR unit may have its own parameter set IDs to specify which parameter sets are associated with the NNR units in the aggregate NNR unit.

Aspect 3: Embodiments may include the syntax element sparsification_flag in model parameter set and layer parameter set as model_sparsification_present_flag and layer_sparsification_present_flag, respectively, and impose a constraint that, when model_sparsification_present_flag is equal to 1, the value of layer_sparsification_present_flag shall be equal to 0, to avoid that the same parameters are present in both parameter sets. In an embodiment, when sparsification parameters are present in both model parameter set and layer parameter set, the values of sparisification parameters override the values of sparisification parameters in layer parameter set.

Aspect 4: Embodiments may include the syntax element quantization_method_flags in model parameter set and layer parameter set as model_quantization_method_flags and layer_quantization_method_flags, respectively, and impose a constraint that model_quantization_method_flags & layer_quantization_method_flags may be required to be equal to 0, to avoid signalling the syntax elements in both model parameter set and layer parameter set. In an embodiment, when quantization parameters are present in both model parameter set and layer parameter set, the values of quantization parameters override the values of quantization parameters in layer parameter set.

Aspect 5: Embodiments may include a general_profile_idc that indicates a profile into NNR start unit (header). The scope of general_profile_idc in NNR start unit may be the entire bitstream.

Aspect 6: Embodiments may not include nnr_model_parameter_set_unit_header( ), nnr_layer_parameter_set_unit_header( ) because it may not have a use case that parameter set and start unit have their headers.

The above aspects and other aspects of embodiments of the present disclosure may be understood based on the following descriptions.

[Aspect 1]

Embodiments of the present disclosure may include a definition of "group of NNR units (GON)" that is a group of NNR units that comprises an entire or partial neural network with a topology. Each GON is self-contained and independently decodable. In an NNR bitstream, one or multiple GONs may be present. This means an NNR bitstream can contains multiple neural networks with multiple topologies. The concept of GON may be equivalent to the coded video sequence (CVS) in VVC/HEVC/AVC, except the time sequential concept. The GON may not have a sequence order with a count information. After NNR start unit is present in each NNR bitstream, each GON may start with an NNR model parameter set unit and followed by NNR layer parameter set, NNR topology unit, and other NNR units.

Embodiments of the present disclosure may, for example, send, receive, and/or decode an NNR bitstream. The NNR bitstream and syntax elements thereof, which may be implemented by embodiments of the present disclosure, are described below.

Figure 3:
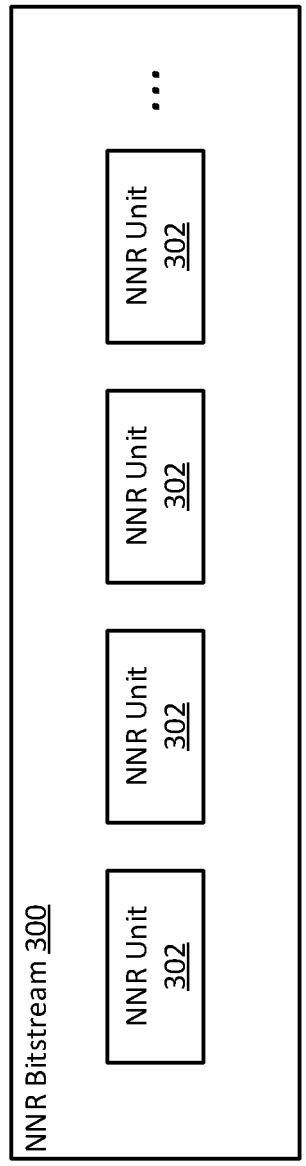
FIG. 3 is a schematic diagram of an NNR bitstream according to embodiments.

(A) Descriptions of NNR Bitstream and General Bitstream Syntax Elements (1) NNR Bitstream With reference to FIG. 3, an NNR bitstream 300 is composed of a sequence of NNR units 302. The first of the NNR units 302 in an NNR bitstream 300 may be required to be an NNR start unit (e.g. NNR unit of type NNR_STR).

(2) NNR Unit

Figure 4:
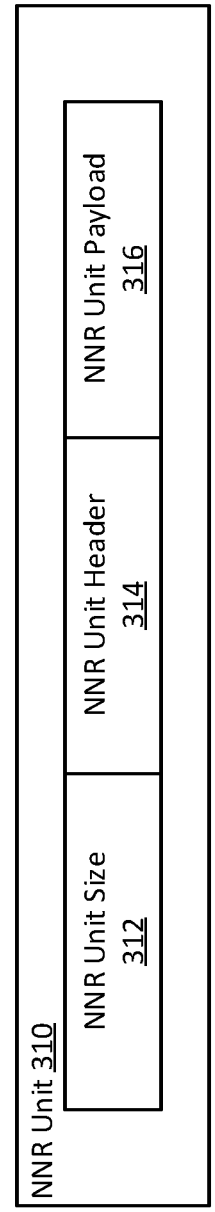
FIG. 4 is a schematic diagram of an NNR unit according to embodiments.

With reference to FIG. 4, one of more of the NNR units 302 may be an NNR unit 310. The NNR unit 310 is a data structure for carrying neural network data and related metadata which is compressed or represented in accordance with embodiments of the present disclosure.

NNR units 310 carry compressed or uncompressed information about neural network metadata, topology information, complete or partial layer data, filters, kernels, biases, quantization weights, tensors or alike.

An NNR unit 310 may comprise or consist of the following data elements:
(a) NNR unit size 312: This data element signals the total byte size of the NNR unit 310, including the NNR unit size.
(b) NNR unit header 314: This data element contains information about the NNR unit type and related metadata.
(c) NNR unit payload 316: This data element contains compressed or uncompressed data related to the neural network.

(3) Aggregate NNR Unit

Figure 5:
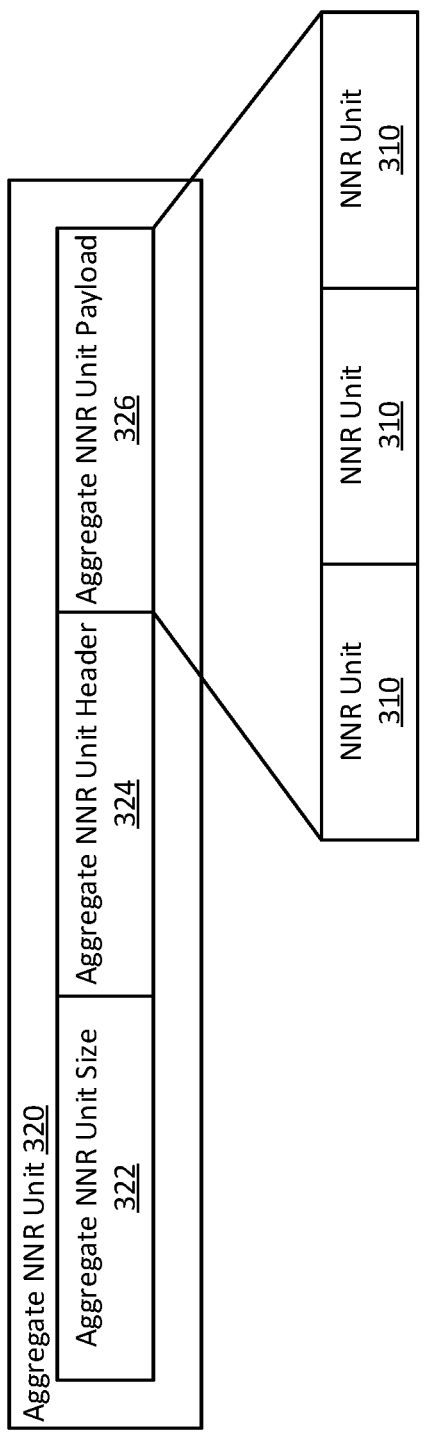
FIG. 5 is a schematic diagram of an aggregate NNR unit according to embodiments.

With reference to FIG. 5, one of more of the NNR units 302 may be an aggregate NNR unit 320. An aggregate NNR unit 320 is an NNR unit which carries multiple NNR units 310 in its payload. Aggregate NNR units 320 provide a grouping mechanism for several NNR units 310 which are related to each other and benefit from aggregation under a single NNR unit 302. For example, the aggregate NNR unit 310 may comprise or consist of the following data elements:
(a) Aggregate NNR unit size 322: This data element signals the total byte size of the aggregate NNR unit 310, including the NNR unit size.
(b) Aggregate NNR unit header 324: This data element contains information about the aggregate NNR unit type and related metadata.
(c) Aggregate NNR unit payload 326: This data element contains the multiple NNR units 310.

(B) Group of NNR Units (GON)

A group of NNR units (GON) 330 comprises an independent neural network with a topology. A GON 330 comprises or consists of an NNR model parameter set unit 331, one or more NNR layer parameter set units 332, an NNR topology unit 333, one or more NNR quantization units 334, and NNR compressed data units 335. After an NNR start unit is present in an NNR bitstream, a GON 330 starts with an NNR model parameter set unit 331, followed by an NNR layer parameter set unit 332, an NNR topology unit 333, and other units.

An NNR bitstream 300 is comprised of one or more GONs. Each GON is independently decodable and extractible.

Each GON 330 may be contained in one or more of the aggregate NNR units 320. For example, each unit of the GON 330 may be a respective NNR unit 310 from among the NNR units 310 of a single one of the aggregate NNR units 320 or a plurality of the aggregate NNR units 320. Each aggregate NNR unit 320 may include at least one associated model parameter set and one associated layer parameter set, when an aggregate NNR unit 320 represents a partial or entire neural network with a topology. Then, the scopes of the associated model parameter set and the associated layer parameter set may be limited to the NNR units contained in (or associated with) the aggregate NNR unit 320. In that case, the aggregate NNR unit 320 may have one or more identifiers to indicate the reference parameter(s).

(C) Aggregate NNR Unit Header Semantics

The aggregate NNR unit header 324 may include syntax elements such as, but not limited to, nnr_aggregate_unit_type, entry_points_present_flag, num_of_nnr_units_minus2, nnr_unit_type[i], nnr_unit_entry_point[i], quant_bitdepth[i], and ctu_scan_order[i].

The syntax element nnr_aggregate_unit_type specifies the type of the aggregate NNR unit 320.

For example, the NNR aggregate unit types may be as specified in TABLE 1 below.

The syntax element entry_points_present_flag specifies whether individual NNR unit entry points are present.

The syntax element num_of_nnr_units_minus2 plus 2 specifies the number of NNR units 310 presented in the NNR aggregate unit's payload.

The syntax element nnr_unit_type[i] specifies the NNR unit type of the NNR unit 310 with index i. This value may be required to be the same as the NNR unit type of the NNR unit 310 at index i.

The syntax element nnr_unit_entry_point[i] specifies the byte offset from the start of the NNR aggregate unit 320 to the start of the NNR unit 310 in NNR aggregate unit's payload and at index i. This value may be required to not be equal or greater than the total byte size of the NNR aggregate unit 320. The syntax element nnr_unit_entry_point values can be used for fast and random access to NNR units 310 inside the NNR aggregate unit payload.

The syntax element quant_bitdepth[i] specifies the max bitdepth of quantized coefficients for each tensor in the NNR aggregate unit 320.

The syntax element ctu_scan_order[i] specifies the CTU-wise scan order for each tensor in the NNR aggregate unit 320. Value 0 indicates that the CTU-wise scan order is raster scan order at horizontal direction, value 1 indicates that the CTU-wise scan order is raster scan order at vertical direction.

[Aspect 2]

Embodiments of the present disclosure may include a model_parameter_set_id and a layer_parameter_set_id, and define the reference rule of the NNR model parameter set and the layer parameter set and their scope, so that only one model parameter set is referenced by all layer parameter sets

TABLE 1

NNR Aggregate Unit Types

| nnr_aggregate_unit_type | Identifier | NNR Aggregate Unit Type | Description |
| --- | --- | --- | --- |
| 0 | NNR_AGG_GEN | Generic NNR aggregate unit | A set of NNR units |
| 1 | NNR_AGG_XYZ_1 | | |
| 2 | NNR_AGG_XYZ_2 | | |
| 3 | NNR_AGG_SLF | Self-contained NNR aggregate unit | When extracted and then concatenated with an NNR_STR and NNR_MPS, an NNR_AGG_SLF may be required to be decodable without any need of additional information and a full or partial NN model may be required to be successfully reconstructable with it. |
| 3..127 | NNR_RSVD | Reserved | MPEG-reserved range |
| 128..255 | NNR_UNSP | Unspecified | Unspecified range | in a GON and a layer parameter set is referenced by one or more NNR quantization and compressed data units. Thus, the structure for hierarchical referencing is that each NNR quantization and compressed data unit refers to an NNR layer parameter set unit that refers to an NNR model parameter set unit.

The concepts of NNR model parameter set and layer parameter set may be equivalent to sequence parameter set and picture parameter set in VVC/HEVC/AVC, respectively.

Embodiments of the present disclosure may implement the following constraints:

(1) An NNR bitstream may start with an NNR start unit (NNR_STR)
(2) There may be a single NNR model parameter set (NNR_MPS) in an NNR bitstream 300 which shall precede any NNR_NDU in the NNR bitstream 300.
(3) NNR layer parameter sets shall be active until the next NNR layer parameter set in the NNR bitstream 300 or until the boundary of an aggregate NNR unit 320 is reached.
(4) The syntax element ref_id values shall be required to be unique in the NNR bitstream 300.
(5) NNR_TPL or NNR_QNT units; if present in the NNR bitstream 300, shall precede any NNR_NDUs that reference their data structures (e.g. ref_ids)

Embodiments of the present disclosure may implement NNR model parameter sets, which may be present in the NNR bitstream 300. Example syntax of an NNR model parameter set is provided below in TABLE 2.

TABLE 2

NNR Model Parameter Set Payload Syntax

|  | Descriptor |
|---|---|
| nnr_model_parameter_set_payload( ) { |  |
|   mps_model_parameter_set_id | u(8) |
|   topology_carriage_flag | u(1) |
|   sparsification_flag | u(1) |
|   quantization_method_flags | u(6) |
|   if ((quantization_method_flags & |  |
|   NNR_QSU) = = NNR_QSU) { |  |
|     qp_density | u(3) |
|     quantization_parameter | i(13) |
|   } |  |
|   If (sparsification_flag = = 1) { |  |
|     sparsification_performance_map( ) |  |
|   } |  |
|   ctu_partition_flag | u(1) |
|   if(ctu_partition flag){ |  |
|     max_ctu_dim_flag | u(2) |
|     nnr_reserved_zero_5bits | u(5) |
|   }else{ |  |
|     nnr_reserved_zero_7bits | u(7) |
|   } |  |
| } |  |

The syntax element mps_model_parameter_set_id specifies an identifier of the model parameter set for reference by other syntax elements.

Embodiments of the present disclosure may implement NNR layer parameter sets, which may be present in the NNR bitstream 300. Example syntax of an NNR layer parameter set is provided below in TABLE 3.

TABLE 3

NNR Layer Parameter Set Unit Payload Syntax

|  | Descriptor |
|---|---|
| nnr_layer_parameter_set_unit_payload( ) { |  |
|   lps_layer_parameter_set_id | u(8) |
|   lps_model_parameter_set_id | u(8) |
|     independently_decodable_flag | u(1) |
|   sparsification_flag | u(1) |
|   quantization_method_flags | u(6) |
|   If ((quantization_method_flags & |  |
|   NNR_QSU) = = NNR_QSU) { |  |
|     quantization_step_size | u(8) |
|   } |  |
|   If ((quantization_method _flags & |  |
|   NNR_QCB) = = NNR_QCB) { |  |
|     quantization_map( ) |  |
|   } |  |
|   If (sparsification_flag == 1) { |  |
|     sparsification_performance_map( ) |  |
|   } |  |
| } |  |

Syntax element lps_layer_parameter_set_id specifies an identifier of the layer parameter set for reference by other syntax elements.

Syntax element lps_model_parameter_set_id specifies the value of mps_model_parameter_set_id for the model parameter set referred to by the layer parameter set. The value of lps_model_parameter_set_id may be required to be the same in all layer parameter sets in a GON.

Embodiments of the present disclosure may implement NNR quantization unit headers of NNR quantization units, which may be present in the NNR bitstream 300. Example syntax of an NNR quantization unit header is provided below in TABLE 4.

TABLE 4

NNR Quantization Unit Header Syntax

|  | Descriptor |
|---|---|
| nnr_quantization_unit_header( ) { |  |
|   qu_layer_parameter_set_id | u(8) |
|   quantization_storage_format | u(8) |
|   quantization_compressed_flag | u(1) |
|   if (quantization_compressed_flag) { |  |
|     compression_format | u(7) |
|   } |  |
|   else { |  |
|     byte_alignment( ) |  |
|   } |  |
| } |  |

The syntax element qu_layer_parameter_set_id specifies the value of lps_layer_parameter_set_id for the layer parameter set referred to by the NNR quantization unit.

Embodiments of the present disclosure may implement NNR compressed data unit headers of NNR compressed data units, which may be present in the NNR bitstream 300. Example syntax of an NNR compressed data unit header is provided below in TABLE 5.

TABLE 5

NNR Compressed Data Unit Header Syntax

| | Descriptor |
|---|---|
| nnr_compressed_data_unit_header( ) { | |
|   cdu_layer_parameter_set_id | u(8) |
|   nnr_compressed_data_unit_payload_type | u(5) |
|   nnr_multiple_topology_elements_present_flag | u(1) |
|   nnr_decompressed_data_format_present_flag | u(1) |
|   input_parameters_present_flag | u(1) |
|   if (nnr_multiple_topology_elements_present_flag = = 1) | |
|     topology_elements_ids_list( ) | |
|   else | |
|     ref_id | st(v) |
|   if (nnr_compressed_data_unit_payload_type = = NNR_PT_CB_FLOAT32) { | |
|     codebook_zero_offset | u(8) |
|     codebook_size | u(16) |
|     for( j = 0 ; j < codebook_size; j++) { | |
|       codebook[j] | flt(32) |
|     } | |
|   } | |
|   if (nnr_decompressed_data_format_present flag = = 1) | |
|     nnr_decompressed_data_format | u(7) |
|   if (input_parameters_present_flag = = 1) { | |
|     tensor_dimensions_flag | u(1) |
|     cabac_unary_length_flag | u(1) |
|     if (tensor_dimensions_flag = = 1) | |
|       tensor_dimensions( ) | |
|     If (cabac_unary_length_flag = = 1) | |
|       cabac_unary_length | u(8) |
|   } | |
|   byte_alignment( ) | |
| } | |

The syntax element cdu_layer_parameter_set_id specifies the value of lps_layer_parameter_set_id for the layer parameter set referred to by the NNR compressed data unit.

[Aspect 3]

Embodiments of the present disclosure may include the syntax element sparsification_flag in NNR model parameter set unit and NNR layer parameter set unit as model_sparsification_present flag and layer_sparsification_present_flag, respectively, and impose a constraint that, when model_sparsification_present_flag is equal to 1, the value of layer_sparsification_present_flag shall be equal to 0, to avoid that the same parameters are present in both parameter sets. In embodiments, model_sparsification_present_flag may be required to be set equal to 1 for global indication of sparsification_performance_map( ) in a GON. Otherwise, model_sparsification_present_flag is set equal to 0 and layer_sparsification_present_flag is set equal to 1 for local indication. Signalling the sparsification_performance_map ( ) in both NNR model parameter set and layer parameter set units may not be efficient and may cause confusion.

In an embodiment, when sparsification parameters are present in both model parameter set and layer parameter set, the values of sparisification parameters override the values of sparisification parameters in layer parameter set.

Example syntax of an NNR model parameter set is provided below in TABLE 6.

TABLE 6

NNR Model Parameter Set Payload Syntax

| | Descriptor |
|---|---|
| nnr_model_parameter_set_payload( ) { | |
|   topology_carriage_flag | u(1) |
|   model_sparsification_flag | u(1) |
|   ... | |

TABLE 6-continued

NNR Model Parameter Set Payload Syntax

| | Descriptor |
|---|---|
|   If (sparsification_flag = = 1) { | |
|     sparsification_performance map( ) | |
|   } | |
|   ... | |
| } | |

Example syntax of an NNR layer parameter set is provided below in TABLE 7.

TABLE 7

NNR Layer Parameter Set Unit Payload Syntax

| | Descriptor |
|---|---|
| nnr_layer_parameter_set_unit_payload( ) { | |
|   independently_decodable_flag | u(1) |
|   layer_sparsification_flag | u(1) |
|   ... | |
|   If (sparsification_flag = =1) { | |
|     sparsification_performance_map( ) | |
|   } | |
| } | |

When model_sparsification_flag is equal to 1, the value of layer_sparsification_flag may be required to be equal to 0.

[Aspect 4]

Embodiments may include the model_quantization_method_present_flag and layer_quantization_method_present_flag in model parameter set and layer parameter set, respectively, and impose a constraint that, when model_quantization_method_present_flag is equal to 1, the value of layer_quantization_method_present_flag shall be equal to 0, to avoid that the same parameters are present in both parameter sets.

Example syntax of an NNR model parameter set is provided below in TABLE 8.

TABLE 8

NNR Model Parameter Set Payload Syntax

| | Descriptor |
|---|---|
| nnr_model_parameter_set_payload( ) { | |
|   topology_carriage_flag | u(1) |
|   sparsification_flag | u(1) |
|   model_quantization_method_flags | u(6) |
|   if ((quantization_method_flags & NNR_QSU) = = NNR_QSU){ | |
|     qp_density | u(3) |
|     quantization_parameter | i(13) |
|   } | |
|   If (sparsification_flag = =1) { | |
|     sparsification_performance_map( ) | |
|   } | |
|   ctu_partition_flag | u(1) |
|   if(ctu_partition_flag) { | |
|     max_ctu_dim_flag | u(2) |
|     nnr_reserved_zero_5bits | u(5) |
|   }else{ | |
|     nnr_reserved_zero_7bits | u(7) |
|   } | |
| } | |

Syntax element model_quantization_method_flags specifies the quantization method(s) used for the whole model. If multiple models are specified, they are combined by OR. As an example, the quantization methods shown in TABLE 9 may be specified.

TABLE 9

Quantization Methods

| Quantization method | Quantization method ID | Value |
|---|---|---|
| Scalar uniform | NNR_QSU | 0x01 |
| Codebook | NNR_QCB | 0x02 |
| Reserved | | 0x03-0xFF |

Example syntax of an NNR layer parameter set is provided below in TABLE 10.

TABLE 10

NNR Layer Parameter Set Unit Payload Syntax

| | Descriptor |
|---|---|
| nnr_layer_parameter_set_unit_payload( ) { | |
|   independently_decodable_flag | u(1) |
|   sparsification_flag | u(1) |
|   layer_quantization_method_flags | u(6) |
|   If ((quantization_method_flags & NNR_QSU) = = NNR_QSU){ | |
|     quantization_step_size | u(8) |
|   } | |
|   If ((quantization_method_flags & NNR_QCB) = = NNR_QCB) { | |
|     quantization_map( ) | |
|   } | |
|   If (sparsification_flag = = 1) { | |
|     sparsification_performance_map( ) | |
|   } | |
| } | |

Syntax element layer_quantization_method_flags specifies the quantization method used for the data contained in the NNR Compressed Data Units to which this Layer Parameter Set refers. If multiple models are specified, they are combined by "OR". As an example, the quantization methods shown below in TABLE 11 may be specified.

TABLE 11

Quantization Methods

| Quantization method | Quantization method ID | Value |
|---|---|---|
| Scalar uniform | NNR_QSU | 0x01 |
| Codebook | NNR_QCB | 0x02 |
| Reserved | | 0x03-0xFF |

The syntax elements model_quantization_method_flags & quantization_method_flags may be required to be equal to 0.

In an embodiment, when quantization parameters are present in both model parameter set and layer parameter set, the values of quantization parameters override the values of quantization parameters in layer parameter set. Such an embodiments is described below with reference to TABLES 12-16.

Example syntax of an NNR model parameter set, in accordance with such an embodiment, is provided below in TABLE 12.

TABLE 12

NNR Model Parameter Set Payload Syntax

| | Descriptor |
|---|---|
| nnr_model_parameter_set_payload( ) { | |
|   topology_carriage_flag | u(1) |
|   mps_sparsification_flag | u(1) |

TABLE 12-continued

NNR Model Parameter Set Payload Syntax

| | Descriptor |
|---|---|
|   mps_quantization_method_flags | u(6) |
|   if ((mps_quantization_method_flags & NNR_QSU) = =NNR_QSU) { | |
|     mps_qp_density | u(3) |
|     mps_quantization_parameter | i(13) |
|   } | |
|   If (mps_sparsification_flag = =1) { | |
|     sparsification_performance_map( ) | |
|   } | |
|   ctu_partition_flag | u(1) |
|   if(ctu_partition_flag) { | |
|     max_ctu_dim_flag | u(2) |
|     nnr_reserved_zero_5bits | u(5) |
|   } else { | |
|     nnr_reserved_zero_7bits | u(7) |
|   } | |
| } | |

Syntax element topology_carriage_flag specifies whether the NNR bitstream 300 carries the topology internally or externally. When set to 1, it specifies that topology is carried within one or more NNR unit types "NNR_TPL". If 0, it specifies that topology is provided externally (i.e., out-of-band with respect to the NNR bitstream 300).

Syntax element mps_quantization_method_flags specifies the quantization method(s) used for the model in the NNR Compressed Data Units that refer to this model parameter set. If multiple models are specified, they are combined by "OR". In such an embodiment, as an example, the quantization methods shown in TABLE 13 may be specified.

TABLE 13

Quantization Methods

| Quantization method | Quantization method ID | Value |
|---|---|---|
| Scalar uniform | NNR_QSU | 0x01 |
| Codebook | NNR_QCB | 0x02 |
| Reserved | | 0x03-0xFF |

Syntax element mps_qp_density specifies density information of syntax element mps_quantization_parameter in the NNR Compressed Data Units that refer to this Model Parameter Set.

Syntax element mps_quantization_parameter specifies the quantization parameter for scalar uniform quantization of parameters of each layer of the neural network for arithmetic coding in the NNR Compressed Data Units that refer to this Model Parameter Set.

Syntax element mps_sparsification_flag specifies whether sparsification is applied to the model in the NNR Compressed Data Units that refer to this Model Parameter Set.

Syntax element sparsification_performance_map( ) specifies a mapping between different sparsification thresholds and resulting NN inference accuracies. The resulting accuracies may be provided separately for different aspects or characteristics of the output of the NN. For a classifier NN, each sparsification threshold may be mapped to separate accuracies for each class, in addition to an overall accuracy which considers all classes. Classes may be ordered based on the neural network output order (e.g. the order specified during training).

Syntax element count thresholds specifies the number of sparsification thresholds.

Syntax element sparsification_threshold specifies the threshold which is applied to the weights of the decoded neural network in order to set the weights to zero (e.g. the weights whose values are less than the threshold are set to zero).

Syntax element non_zero_ratio specifies the non-zero ratio that is achieved by applying the sparsification_threshold to sparsify the weights.

Syntax element nn_accuracy specifies the overall accuracy of the NN (e.g. classification accuracy by considering all classes).

Syntax element count_classes specifies number of classes for which separate accuracies are provided for each sparsification thresholds.

Syntax element nn_class_accuracy specifies the accuracy for a certain class, when a certain sparsification_threshold is applied.

Syntax element ctu_partition_flag specifies if the block partitioning is enabled for weight tensor of each layer of the neural network. Value 0 indicates that the block partitioning is disabled, value 1 indicates that the block partitioning is enabled where the partitioned block is defined as coding tree unit (CTU).

Syntax element max_ctu_dim_flag specifies the model-wise max CTU dimension for weight tensor of the neural network: gctu_dim=(64»max_ctu_dim_flag). Tensor-wise max CTU width is scaled by the kernel size of each convolution tensor: max_ctu_height=gctu_dim, max_ctu_width=gctu_dim*kernel_size. The height/width of right/bottom CTUs may be less than the max_ctu_height/max_ctu_width.

Example syntax of an NNR layer parameter set is provided below in TABLE 14.

TABLE 14

NNR Layer Parameter Set Unit Payload Syntax

| | Descriptor |
|---|---|
| nnr_layer_parameter_set_unit_payload() { | |
|   independently_decodable_flag | u(1) |
|   lps_sparsification_flag | u(1) |
|   lps_quantization_method_flags | u(6) |
|   If ((lps_quantization_method_flags & NNR_QSU) == NNR_QSU) { | |
|     lps_quantization_step_size | u(8) |
|   } | |
|   If ((lps_quantization_method_flags & NNR_QCB) == NNR_QCB) { | |
|     quantization_map() | |
|   } | |
|   If (lps_sparsification_flag ==1) { | |
|     sparsification_performance_map( ) | |
|   } | |
| } | |

Syntax element lps_quantization_method_flags specifies the quantization method used for the data contained in the NNR Compressed Data Units that refers to this Layer Parameter Set. If multiple models are specified, they are combined by "OR". As an example, the quantization methods shown below in TABLE 15 may be specified.

TABLE 15

Quantization Methods

| Quantization method | Quantization method ID | Value |
|---|---|---|
| Scalar uniform | NNR_QSU | 0x01 |
| Codebook | NNR_QCB | 0x02 |
| Reserved | | 0x03-0xFF |

Syntax element lps_quantization_step_size specifies the step interval for scalar uniform quantization method used for the data contained in the NNR Compressed Data Units that refers to this Layer Parameter Set.

Syntax element quantization_map( ) specifies a codebook for codebook-based quantization method.

Syntax element compressed_flag specifies whether the quantization map data is further compressed.

Syntax element compression_format is an enumerated list which takes one of the following values shown below in TABLE 16, and indicates the compression method utilized for further compressing the quantization_map_data( ):

TABLE 16

Compression Formats and Values

| compression_format | Type identifier | Type enumeration (7 bits) |
|---|---|---|
| Uncompressed | NNR_PT_RAW | 0x00 |
| Deflate as defined in RFC 1950 | NNR_DFL | 0x01 |
| Reserved | | 0x02-0x7F |

Syntax element index_precision specifies the integer type used in the key values of quantization_map_data( ). A value of 0 indicates 8 bits precision, value of 1 indicates 16 bits precision, and a value of 2 indicates 32 bits precision. The other values are reserved.

Syntax element quantization_map_data( ) specifies an array or dictionary of the form {[index<index_precision>: value<float(32)>]} where index is a quantized value indicator and the second value is a signed floating-point value corresponding to that quantized value index.

Syntax element lps_sparsification_flag specifies whether sparsification was applied to the model in the NNR Compressed Data Units that refers to this Layer Parameter Set.

Syntax element sparsification_performance_map( ) specifies a mapping between different sparsification thresholds and resulting NN inference accuracies. The resulting accuracies may be provided separately for different aspects or characteristics of the output of the NN. For a classifier NN, each sparsification threshold may be mapped to separate accuracies for each class, in addition to an overall accuracy which considers all classes. Classes may be ordered based on the neural network output order, i.e, the order specified during training.

When mps_sparsification_flag & lps_sparsification_flag is equal to 1, the values of syntax elements in sparsification_performance_map( ) in layer parameter set may be used in the NNR Compressed Data Units that refers to this Layer Parameter Set, by overriding the values of syntax elements in sparsification_performance_map( ) in model parameter set.

[Aspect 5]

Embodiments of the present disclosure may include a general_profile_idc that indicates a profile in NNR start unit (header). Profile information is important to provide information on what coding algorithms and topologies are used in the NNR bitstream 300.

Embodiments of the present disclosure may implement NNR start unit headers, which may be present in the NNR bitstream 300. Example syntax of an NNR start unit header is provided below in TABLE 17.

TABLE 17

NNR Start Unit Header syntax

| | Descriptor |
|---|---|
| nnr_start_unit_header( ) { | |
|   general_profile_idc | u(8) |
| } | |

The syntax element general_profile_idc indicates a profile to which the NNR bitstream 300 conforms. Bitstreams may be required to not contain values of general_profile_idc other than those specified in a specification.

[Aspect 6]

Embodiments of the present disclosure may not include nnr_model_parameter_set_unit_header( ), nnr_layer_parameter_set_unit_header( ) because it may not have a use case that parameter set and start unit have their headers.

[Additional Aspects]

Additional aspects of embodiments of the present disclosure are described below.

(A) When the value of partial_data_counter in NNR unit header is equal to 0, the value of independently_decodable_flag in NNR unit header may be equal to 0, because when a NNR unit contains the whole data of a topology, that unit should be independently decodable. According to embodiments, the value of independently_decodable_flag in NNR unit header may be determined to be equal to 0 by a decoder in such a case.

Example syntax of an NNR unit is provided below in TABLE 18.

TABLE 18

NNR Unit Syntax

| | Descriptor |
|---|---|
| nnr_unit(numBytesInNNRUnit ) { | |
|   nnr_unit_size( ) | |
|   nnr_unit_header( ) | |
|   nnr_unit_payload( ) | |
| } | |

Example syntax of an NNR unit size is provided below in TABLE 19.

TABLE 19

NNR Unit Size Syntax

| | Descriptor |
|---|---|
| nnr_unit_size( ) { | |
|   nnr_unit_size_flag | u(1) |
|   nnr_unit_size | u(15 + nnr_unit_size_flag*16) |
| } | |

Example syntax of an NNR unit header is provided below in TABLE 20.

TABLE 20

NNR Unit Header Syntax

| | Descriptor |
|---|---|
| nnr_unit_header( ) { | |
|   nnr_unit_type | u(8) |
|   partial_data_counter | u(8) |
|   independently_decodable_flag | u(1) |
|   reserved | u(7) |
|   if( nnr_unit_type = = NNR_MPS ) | |
|     nnr_model_parameter_set_unit_header( ) | |
|   if( nnr_unit_type = = NNR_LPS ) | |
|     nnr_layer_parameter_set_unit_header( ) | |
|   if( nnr_unit_type = = NNR_TPL ) | |
|     nnr_topology_unit_header( ) | |
|   if( nnr_unit_type = = NNR_QNT ) | |
|     nnr_quanization_unit_header( ) | |
|   if( nnr_unit_type = = NNR_NDU ) | |
|     nnr_compressed_data_unit_header( ) | |
|   if( nnr_unit_type = = NNR_STR ) | |
|     nnr_start_unit_header( ) | |
|   if( nnr_unit_type = = NNR_AGG ) | |
|     nnr_aggregate_unit header( ) | |
| } | |

Syntax element partial_data_counter specifies the index of the partial data carried in the payload of this NNR Data Unit with respect to the whole data for a certain topology element. A value of 0 indicates no partial information (i.e. the data in this NNR Unit is all data associated to a topology element and it is complete), and a value bigger than 0 indicates the index of the partial information (i.e. data in this NNR Unit should be concatenated with the data in accompanying NNR Units until partial_data_counter of an NNR Unit reaches 0). This counter may count backwards to indicate initially the total number of partitions.

Syntax element independently_decodable_flag specifies whether this compressed data unit is independently decodable. A value of 0 indicates an independently decodable NNR Unit. A value of 1 indicates that this NNR Unit is not independently decodable and its payload should be combined with other NNR Units for successful decodability/ decompressibility. When the value of partial_data_counter is equal to 0, the value of independently_decodable_flag may be required to be equal to 0.

(B) When an NNR unit is independently decodable, partial_data_counter may not be signaled in nnr_unit_header and the value of partial_data_counter may be inferred (e.g. by a decoder) to be equal to 0.

Example syntax of an NNR unit header is provided below in TABLE 21.

TABLE 21

NNR Unit Header Syntax

| | Descriptor |
|---|---|
| nnr_unit_header( ) { | |
|   nnr_unit_type | u(8) |
|   independently_decodable_flag | u(1) |
|   reserved | u(7) |
|   if( independently_decodable_flag ) | |
|     partial_data_counter | u(8) |
|   if( nnr_unit_type = = NNR_MPS ) | |
|     nnr_model_parameter_set_unit_header( ) | |
|   if( nnr_unit_type = = NNR_LPS ) | |
|     nnr_layer_parameter_set_unit_header( ) | |

TABLE 21-continued

NNR Unit Header Syntax

| | Descriptor |
|---|---|
| if( nnr_unit_type = = NNR_TPL ) | |
|   nnr_topology_unit_header( ) | |
| if( nnr_unit_type = = NNR_QNT ) | |
|   nnr_quanization_unit_header( ) | |
| if( nnr_unit_type = = NNR_NDU ) | |
|   nnr_compressed_data_unit_header( ) | |
| if( nnr_unit_type = = NNR_STR ) | |
|   nnr_start_unit_header( ) | |
| if( nnr_unit_type = = NNR_AGG ) | |
|   nnr_aggregate_unit_header( ) | |
| } | |

Syntax element independently_decodable_flag specifies whether this compressed data unit is independently decodable. A value of 0 indicates an independently decodable NNR Unit. A value of 1 indicates that this NNR Unit is not independently decodable and its payload should be combined with other NNR Units for successful decodability/decompressibility.

Syntax element partial_data_counter specifies the index of the partial data carried in the payload of this NNR Data Unit with respect to the whole data for a certain topology element. A value of 0 indicates no partial information (i.e. the data in this NNR Unit is all data associated to a topology element and it is complete), and a value bigger than 0 indicates the index of the partial information (i.e. data in this NNR Unit should be concatenated with the data in accompanying NNR Units until partial_data_counter of an NNR Unit reaches 0). This counter may count backwards to indicate initially the total number of partitions. When not present, the value of partial_data_counter may be inferred (e.g. by a decoder) to be equal to 0.

(C) When an NNR unit is independently decodable, the value of partial_data_counter may be equal to 0.

Example syntax of an NNR unit header is provided below in TABLE 22.

TABLE 22

NNR Unit Header Syntax

| | Descriptor |
|---|---|
| nnr_unit_header( ) { | |
|   nnr_unit_type | u(8) |
|   independently_decodable_flag | u(1) |
|   reserved | u(7) |
|   partial_data_counter | u(8) |
|   if( nnr_unit_type = = NNR_MPS ) | |
|     nnr_model_parameter_set_unit_header( ) | |
|   if( nnr_unit_type = = NNR_LPS ) | |
|     nnr_layer_parameter_set_unit_header( ) | |
|   if( nnr_unit_type = = NNR_TPL ) | |
|     nnr_topology_unit_header( ) | |
|   if( nnr_unit_type = = NNR_QNT ) | |
|     nnr_quanization_unit_header( ) | |
|   if( nnr_unit_type = = NNR_NDU ) | |
|     nnr_compressed_data_unit_header( ) | |
|   if( nnr_unit_type = = NNR_STR ) | |
|     nnr_start_unit_header( ) | |
|   if( nnr_unit_type = = NNR_AGG ) | |
|     nnr_aggregate_unit_header( ) | |
| } | |

Syntax element independently_decodable_flag specifies whether this compressed data unit is independently decodable. A value of 0 indicates an independently decodable NNR Unit. A value of 1 indicates that this NNR Unit is not independently decodable and its payload should be combined with other NNR Units for successful decodability/decompressibility.

Syntax element partial_data_counter specifies the index of the partial data carried in the payload of this NNR Data Unit with respect to the whole data for a certain topology element. A value of 0 indicates no partial information (i.e. the data in this NNR Unit is all data associated to a topology element and it is complete), and a value bigger than 0 indicates the index of the partial information (i.e. data in this NNR Unit should be concatenated with the data in accompanying NNR Units until partial_data_counter of an NNR Unit reaches 0). This counter may count backwards to indicate initially the total number of partitions. When independently_decodable_flag is equal to 1, the value of partial_data_counter may be inferred (e.g. by a decoder) to be equal to 0.

(D) According to embodiments, the semantics of independently_decodable_flag may be changed as below.

Syntax element independently_decodable_flag specifies whether this compressed data unit is independently decodable. A value of 0 indicates an independently decodable NNR Unit and no partial information (i.e. the data in this NNR Unit is all data associated to a topology element and it is complete). A value of 1 indicates that this NNR Unit is not independently decodable and its payload should be combined with other NNR Units for successful decodability/decompressibility.

(E) According to embodiments, the semantics of partial_data_counter may be changed as below.

The syntax element partial_data_counter specifies the index of the partial data carried in the payload of this NNR Data Unit with respect to the whole data for a certain topology element. A value of 0 indicates no partial information (i.e. the data in this NNR Unit is all data associated to a topology element and it is complete) and the NNR unit with partial_data_counter equal to 0 is independently decodable. A value bigger than 0 indicates the index of the partial information (i.e. data in this NNR Unit should be concatenated with the data in accompanying NNR Units until partial_data_counter of an NNR Unit reaches 0). This counter may count backwards to indicate initially the total number of partitions. When independently_decodable_flag is equal to 1, the value of partial_data_counter may be inferred (e.g. by a decoder) to be equal to 0.

(F) According to embodiments, when nnr_unit_type is equal to NNR_STR or NNR_MPS, the value of independently_decodable_flag may be equal to 0.

(G) According to embodiments, when nnr_unit_type is equal to NNR_STR, NNR_MPS, NNR LPS, NNR_TPL, NNR_QNT, NNR_NDU or NNR_AGG, the value of independently_decodable_flag may be equal to 0.

(H) According to embodiments, when nnr_unit_type is equal to NNR_STR or NNR_AGG, the value of partial_data_counter may be equal to 0.

(I) According to embodiments, when nnr_unit_type is equal to NNR_AGG and nnr_aggregate_unit_type is equal to NNR_AGG_SLF, the value of partial_data_counter may be equal to 0.

(J) According to embodiments, when nnr_unit_type is equal to NNR_AGG and nnr_aggregate_unit_type is equal to NNR_AGG_SLF, the value of independently_decodable_flag may be equal to 0.

(K) According to embodiments, lps_independently_decodable_flag is signaled in layer parameter set and its semantics are as shown below in TABLE 23.

TABLE 23

NNR Layer Parameter Set Syntax

| | Descriptor |
|---|---|
| nnr_layer_parameter_set_unit_payload( ) { | |
|     lps_independently_decodable_flag | u(1) |
|     lps_sparcification_flag | u(1) |
|     lps_unification_flag | u(1) |
|     lps_quantization_method_flags | u(5) |
|     if ((lps_quantization_method_flags & NNR_QCB) = = NNR_QCB \|\| (lps_quantization_method_flags & NNR_QSU) = = NNR_QSU) { | |
|         lps_qp_density | u(3) |
|         lps_quantization_parameter | i(13) |
|         if ((lps_quantization_method_flags & NNR_QCB) = = NNR_QCB) { | |
|             quantization_map_compressed_flag | u(1) |
|             if (quantization_map_compressed_flag = = 1) | |
|                 quantization_map_compression_format | u(7) |
|             else | |
|                 byte_alignment( ) | |
|             quantization_map_index_precision | u(8) |
|             indexSz = 1 << (quantization_map_index_precision + 3) | |
|             quantization_map_data( ) | ue(v) |
|         } | |
|     } | |
|     if (lps_sparcification_flag = = 1) { | |
|         sparsification_performance_map( ) | |
|     } | |
|     if (lps_unification_flag = = 1) { | |
|         unification_performance_map( ) | |
|     } | |
| } | |

Syntax element lps_independently_decodable_flag specifies whether NNR units that refer to the layer parameter set are independently decodable. A value of 0 indicates independently decodable NNR Units. A value of 1 indicates that the NNR Units that refer to the layer parameter set are not independently decodable and their payload should be combined with NNR Units that refer to other layer parameter sets for successful decodability/decompressibility.

(L) According to embodiments, the value of lps_independently_decodable_flag may be equal to the value of independently_decodable_flag in NNR unit header.

(M) According to embodiments, the independently_decodable_flag is replaced by a reserved bit as shown below in TABLE 24.

TABLE 24

NNR Layer Parameter Set Syntax

| | Descriptor |
|---|---|
| nnr_layer_parameter_set_unit_payload( ) { | |
|     reserved | u(1) |
|     lps_sparsification_flag | u(1) |
|     lps_unification_flag | u(1) |
|     lps_quantization_method_flags | u(5) |
|     if ((lps_quantization_method_flags & NNR_QCB) = = NNR_QCB \|\| (lps_quantization_method_flags & NNR_QSU) = = NNR_QSU) { | |
|         lps_qp_density | u(3) |
|         lps_quantization_parameter | i(13) |
|         if ((lps_quantization_method_flags & NNR_QCB) = = NNR_QCB) { | |
|             quantization_map_compressed_flag | u(1) |
|             if (quantization_map_compressed_flag = = 1) | |
|                 quantization_map_compression_format | u(7) |
|             else | |
|                 byte_alignment( ) | |
|             quantization_map_index_precision | u(8) |
|             indexSz = 1 << (quantization_map_index_precision + 3) | |
|             quantization_map_data( ) | ue(v) |
|         } | |
|     } | |
|     if (lps_sparsification_flag = = 1) { | |
|         sparsification_performance_map( ) | |
|     } | |
|     if (lps_unification_flag = = 1) { | |
|         unification_performance_map( ) | |
|     } | |
| } | |

(N) According to embodiments, syntax and semantics are presented in NNR model parameter set as described below and as shown in TABLE 25.

TABLE 25

NNR Model Parameter Set Unit Header Syntax

| | Descriptor |
|---|---|
| nnr_model_parameter_set_header( ) { | |
|     mps_independently_decodable_flag | u(1) |
|     reserved | u(7) |
| } | |

Syntax element mps_independently_decodable_flag equal to 0 specifies that NNR units that refer to the model parameter set are independently decodable and a full or partial NN model shall be successfully reconstructable with the NNR units. A value of 1 indicates that the NNR Units that refer to the model parameter set are not independently decodable and their payload should be combined with NNR Units that refer to other model parameter sets for successful construction of a full or partial NN model.

(O) According to embodiments, the following syntax and semantics are presented in NNR layer parameter set as described below and as shown in TABLE 26.

TABLE 26

NNR Layer Parameter Set Unit Header Syntax

| | Descriptor |
|---|---|
| nnr_model_parameter_set_header( ) { | |
|     lps_independently_decodable_flag | u(1) |
|     reserved | u(7) |
| } | |

Syntax element lps_independently_decodable_flag equal to 0 specifies that NNR units that refer to the layer parameter set are independently decodable and a full or partial NN model shall be successfully reconstructable with the NNR units. A value of 1 indicates that the NNR Units that refer to the layer parameter set are not independently decodable and their payload should be combined with NNR Units that refer to other layer parameter sets for successful construction of a full or partial NN model.

(P) According to embodiments, the syntax structure shown below in TABLE 27 may be used for NNR unit header.

TABLE 27

NNR Unit Header

| | Descriptor |
|---|---|
| nnr_unit_header( ) { | |
|   nnr_unit_type | u(7) |
|   nnr_unit_header_extension_flag | u(1) |
|   if( nnr_unit_header_extension_flag) { | |
|     independently_decodable_flag | u(1) |
|     partial_data_counter | u(7) |
|   } | |
|   if( nnr_unit_type = = NNR_MPS ) | |
|     nnr_model_parameter_set_unit_header( ) | |
|   if( nnr_unit_type = = NNR_LPS ) | |
|     nnr_layer_parameter_set_unit_header( ) | |
|   if( nnr_unit_type = = NNR_TPL ) | |
|     nnr_topology_unit_header( ) | |
|   if( nnr_unit_type = = NNR_QNT ) | |
|     nnr_quanization_unit_header( ) | |
|   if( nnr_unit_type = = NNR_NDU ) | |
|     nnr_compressed_data_unit_header( ) | |
|   if( nnr_unit_type = = NNR_STR ) | |
|     nnr_start_unit_header( ) | |
|   if( nnr_unit_type = = NNR_AGG ) | |
|     nnr_aggregate_unit_header( ) | |
| } | |

Syntax element nnr_unit_type specifies the type of the NNR unit, as specified below in TABLE 28.

TABLE 28

NNR Unit Types

| nnr_unit_type Identifier | NNR Unit Type | Description |
|---|---|---|
| 0 | NNR_STR | NNR start unit | Compressed neural network bitstream start indicator |
| 1 | NNR_MPS | NNR model parameter set data unit | Neural network global metadata and information |
| 2 | NNR_LPS | NNR layer parameter set data unit | Metadata related to a partial representation of neural network |
| 3 | NNR_TPL | NNR topology data unit | Neural network topology information |
| 4 | NNR_QNT | NNR quantization data unit | Neural network quantization information |
| 5 | NNR_NDU | NNR compressed data unit | Compressed neural network data |
| 6 | NNR_AGG | NNR aggregate unit | NNR unit with payload containing multiple NNR units |
| 7 ... 63 | NNR_RSVD | Reserved | MPEG-reserved range |
| 64 ... 127 | NNR_UNSP | Unspecified | Unspecified range |

Syntax element nnr_unit_header_extension_flag equal to 1 specifies that the syntax elements partial_data_counter and independently_decodable_flag are present in NNR unit header. Syntax element nnr_unit_header_extension_flag equal to 0 specifies that the syntax elements partial_data_counter and independently_decodable_flag are not present in NNR unit header.

Syntax element partial_data_counter specifies the index of the partial data carried in the payload of this NNR Data Unit with respect to the whole data for a certain topology element. A value of 0 indicates no partial information (i.e. the data in this NNR Unit is all data associated to a topology element and it is complete), and a value bigger than 0 indicates the index of the partial information (i.e. data in this NNR Unit should be concatenated with the data in accompanying NNR Units until partial_data_counter of an NNR Unit reaches 0). This counter may count backwards to indicate initially the total number of partitions. When not present, the value of partial_data_counter may be inferred (e.g. by a decoder) to be equal to 0. The value of partial_data_counter may be in the range of 0 to 126, inclusive. The value of 127 may be reserved for future proof.

Syntax element independently_decodable_flag specifies whether this compressed data unit is independently decodable. A value of 0 indicates an independently decodable NNR Unit. A value of 1 indicates that this NNR Unit is not independently decodable and its payload should be combined with other NNR Units for successful decodability/decompressibility. When not present, the value of independently_decodable_fag may be inferred (e.g. by a decoder) to be equal to 0.

(Q) According to embodiments, the syntax structure shown below in TABLE 29 may be used for NNR unit header.

TABLE 29

NNR Unit Header Syntax

| | Descriptor |
|---|---|
| nnr_unit_header( ) { | |
|   nnr_unit_type | u(7) |
|   nnr_unit_header_extension_flag | u(1) |
|   if( nnr_unit_header_extension_flag) { | |

TABLE 29-continued

NNR Unit Header Syntax

| | Descriptor |
|---|---|
|     partial_data_counter | u(6) |
|     independently_decodable_flag | u(1) |
|     reserved_bit | u(1) |
|   } | |
|   if( nnr_unit_type = = NNR_MPS ) | |
|     nnr_model_parameter_set_unit_header( ) | |
|   if( nnr_unit_type = = NNR_LPS ) | |
|     nnr_layer_parameter_set_unit_header( ) | |
|   if( nnr_unit_type = = NNR_TPL ) | |
|     nnr_topology_unit_header( ) | |
|   if( nnr_unit_type = = NNR_QNT ) | |
|     nnr_quanization_unit_header( ) | |
|   if( nnr_unit_type = = NNR_NDU ) | |
|     nnr_compressed_data_unit_header( ) | |
|   if( nnr_unit_type = = NNR_STR ) | |
|     nnr_start_unit_header( ) | |

TABLE 29-continued

NNR Unit Header Syntax

```
                                                    Descriptor
     if( nnr_unit_type = = NNR_AGG )
       nnr_aggregate_unit_header( )
   }
```

Syntax element nnr_unit_type specifies the type of the NNR unit, as specified below in TABLE 30.

TABLE 30

NNR Unit Types

| nnr_unit_type | Identifier | NNR Unit Type | Description |
|---|---|---|---|
| 0 | NNR_STR | NNR start unit | Compressed neural network bitstream start indicator |
| 1 | NNR_MPS | NNR model parameter set data unit | Neural network global metadata and information |
| 2 | NNR_LPS | NNR layer parameter set data unit | Metadata related to a partial representation of neural network |
| 3 | NNR_TPL | NNR topology data unit | Neural network topology information |
| 4 | NNR_QNT | NNR quantization data unit | Neural network quantization information |
| 5 | NNR_NDU | NNR compressed data unit | Compressed neural network data |
| 6 | NNR_AGG | NNR aggregate unit | NNR unit with payload containing multiple NNR units |
| 7 . . . 63 | NNR_RSVD | Reserved | MPEG-reserved range |
| 64 . . . 127 | NNR_UNSP | Unspecified | Unspecified range |

Syntax element nnr_unit_header_extension_flag equal to 1 specifies that the syntax elements partial_data_counter and independently_decodable_flag are present in NNR unit header. Syntax element nnr_unit_header_extension_flag equal to 0 specifies that the syntax elements partial_data_counter and independently_decodable_flag are not present in NNR unit header.

Syntax element partial_data_counter specifies the index of the partial data carried in the payload of this NNR Data Unit with respect to the whole data for a certain topology element. A value of 0 indicates no partial information (i.e. the data in this NNR Unit is all data associated to a topology element and it is complete), and a value bigger than 0 indicates the index of the partial information (i.e. data in this NNR Unit should be concatenated with the data in accompanying NNR Units until partial_data_counter of an NNR Unit reaches 0). This counter may count backwards to indicate initially the total number of partitions. When not present, the value of partial_data_counter may be inferred (e.g. by a decoder) to be equal to 0. The value of partial_data_counter may be in the range of 0 to 127, inclusive.

Syntax element independently_decodable_flag specifies whether this compressed data unit is independently decodable. A value of 0 indicates an independently decodable NNR Unit. A value of 1 indicates that this NNR Unit is not independently decodable and its payload should be combined with other NNR Units for successful decodability/decompressibility. When not present, the value of independently_decodable_fag may be inferred (e.g. by a decoder) to be equal to 0.

The syntax element reserved bit may be used for future proof.

(R) According to embodiments, the syntax structure shown below in TABLE 31 may be used for NNR unit header.

TABLE 31

NNR Unit Header Syntax

```
                                                    Descriptor
nnr_unit_header( ) {
  nnr_unit_type                                     u(7)
  Independent_self_contained_flag                   u(1)
  if( nnr_unit_header_extension_flag ) {
    partial_data_counter                            u(7)
    independently_decodable_flag                    u(1)
  }
  if( nnr_unit_type = = NNR_MPS )
    nnr_model_parameter_set_unit_header( )
  if( nnr_unit_type = = NNR_LPS )
    nnr_layer_parameter_set_unit_header( )
  if( nnr_unit_type = = NNR_TPL )
    nnr_topology_unit_header( )
  if( nnr_unit_type = = NNR_QNT )
    nnr_quanization_unit_header( )
  if( nnr_unit_type = = NNR_NDU )
    nnr_compressed_data_unit_header( )
  if( nnr_unit_type = = NNR_STR )
    nnr_start_unit_header( )
  if( nnr_unit_type = = NNR_AGG )
    nnr_aggregate_unit_header( )
}
```

Syntax element nnr_unit_type specifies the type of the NNR unit, as specified below in TABLE 32.

TABLE 32

NNR Unit Types

| nnr_unit_type Identifier | NNR Unit Type | | Description |
|---|---|---|---|
| 0 | NNR_STR | NNR start unit | Compressed neural network bitstream start indicator |
| 1 | NNR_MPS | NNR model parameter set data unit | Neural network global metadata and information |
| 2 | NNR_LPS | NNR layer parameter set data unit | Metadata related to a partial representation of neural network |
| 3 | NNR_TPL | NNR topology data unit | Neural network topology information |
| 4 | NNR_QNT | NNR quantization data unit | Neural network quantization information |
| 5 | NNR_NDU | NNR compressed data unit | Compressed neural network data |
| 6 | NNR_AGG | NNR aggregate unit | NNR unit with payload containing multiple NNR units |
| 7 ... 63 | NNR_RSVD | Reserved | MPEG-reserved range |
| 64 ... 127 | NNR_UNSP | Unspecified | Unspecified range |

Syntax element Independent_self_contained_flag equal to 1 specifies that the NNR unit is independently decodable and self-contained (i.e. the data in this NNR Unit is all data associated to a topology element and it is complete). When the value of Independent_self_contained_flag is equal to 1, the syntax elements partial_data_counter and independently_decodable_flag are not present in the NNR unit header and the values of partial_data_counter and independently_decodable_flag may be inferred (e.g. by an encoder) to be equal to 0. Independent_self_contained_flag equal to 0 specifies that the syntax elements partial_data_counter and independently_decodable_flag are present in the NNR unit header. When Independent_self_contained_flag is equal to 0, one of partial_data_counter and independently_decodable_flag may be required to have a non-zero value.

Syntax element partial_data_counter specifies the index of the partial data carried in the payload of this NNR Data Unit with respect to the whole data for a certain topology element. A value of 0 indicates no partial information (i.e. the data in this NNR Unit is all data associated to a topology element and it is complete), and a value bigger than 0 indicates the index of the partial information (i.e. data in this NNR Unit should be concatenated with the data in accompanying NNR Units until partial_data_counter of an NNR Unit reaches 0). This counter may count backwards to indicate initially the total number of partitions. When not present, the value of partial_data_counter may be inferred (e.g. by a decoder) to be equal to 0. The value of partial_data_counter may be in the range of 0 to 126, inclusive. The value of 127 may be reserved for future proof.

Syntax element independently_decodable_flag specifies whether this compressed data unit is independently decodable. A value of 0 indicates an independently decodable NNR Unit. A value of 1 indicates that this NNR Unit is not independently decodable and its payload should be combined with other NNR Units for successful decodability/decompressibility. When not present, the value of independently_decodable_fag may be inferred (e.g. by a decoder) to be equal to 0.

(S) According to embodiments, the syntax and semantics described below and shown below in TABLE 33 are presented in NNR model parameter set.

TABLE 33

NNR Model Parameter Set Unit Header Syntax

| | Descriptor |
|---|---|
| nnr_model_parameter_set_header( ) { | |
|   mps_independent_self_contained_flag | u(1) |
|   reserved | u(7) |
| } | |

Syntax element mps_independent_self_contained_flag equal to 0 specifies that NNR units that refer to the model parameter set are independently decodable and a full or partial NN model shall be successfully reconstructable with the NNR units. A value of 1 indicates that the NNR Units that refer to the model parameter set are not independently decodable and their payload should be combined with NNR Units that refer to other model parameter sets for successful construction of a full or partial NN model.

(T) According to embodiments, the syntax and semantics described below and shown below in TABLE 34 are presented in NNR layer parameter set.

TABLE 34

NNR Layer Parameter Set Unit Header Syntax

| | Descriptor |
|---|---|
| nnr_layer_parameter_set_header( ) { | |
|   lps_independent_self_contained_flag | u(1) |
|   reserved | u(7) |
| } | |

Syntax element lps_independent_self_contained_flag equal to 0 specifies that NNR units that refer to the layer parameter set are independently decodable and a full or partial NN model shall be successfully reconstructable with the NNR units. A value of 1 indicates that the NNR Units that refer to the layer parameter set are not independently decodable and their payload should be combined with NNR Units that refer to other layer parameter sets for successful construction of a full or partial NN model.

(U) According to embodiments, the syntax and semantics described below and shown below in TABLE 35 are presented in NNR model parameter set.

TABLE 35

NNR Model Parameter Set Unit Header Syntax

| | Descriptor |
|---|---|
| nnr_model_parameter_set_header( ) { | |
|   mps_independently_decodable_flag | u(1) |
|   mps_self_contained_flag | u(1) |
|   reserved | u(6) |
| } | |

Syntax element mps_independently_decodable_flag equal to 0 specifies that NNR units that refer to the model parameter set are independently decodable. A value of 1 indicates that the NNR Units that refer to the model parameter set are not independently decodable.

Syntax element mps_self_contained_flag equal to 0 specifies that NNR units that refer to the model parameter set are a full or partial NN model that shall be successfully reconstructable with the NNR units. A value of 1 indicates that the NNR Units that refer to the model parameter set should be combined with NNR Units that refer to other model parameter sets for successful construction of a full or partial NN model.

(V) According to embodiments, the syntax and semantics described below and shown below in TABLE 36 are presented in NNR layer parameter set.

TABLE 36

NNR Layer Parameter Set Unit Header

| | Descriptor |
|---|---|
| nnr_layer_parameter_set_header( ) { | |
|   lps_independently_decodable_flag | u(1) |
|   lps_self_contained_flag | u(1) |
|   reserved | u(6) |
| } | |

Syntax element lps_independently_decodable_flag equal to 0 specifies that NNR units that refer to the layer parameter set are independently decodable. A value of 1 indicates that the NNR Units that refer to the layer parameter set are not independently decodable.

Syntax element lps_self_contained_flag equal to 0 specifies that NNR units that refer to the layer parameter set are a full or partial NN model that shall be successfully reconstructable with the NNR units. A value of 1 indicates that the NNR Units that refer to the layer parameter set should be combined with NNR Units that refer to other layer parameter sets for successful construction of a full or partial NN model.

Figure 6:
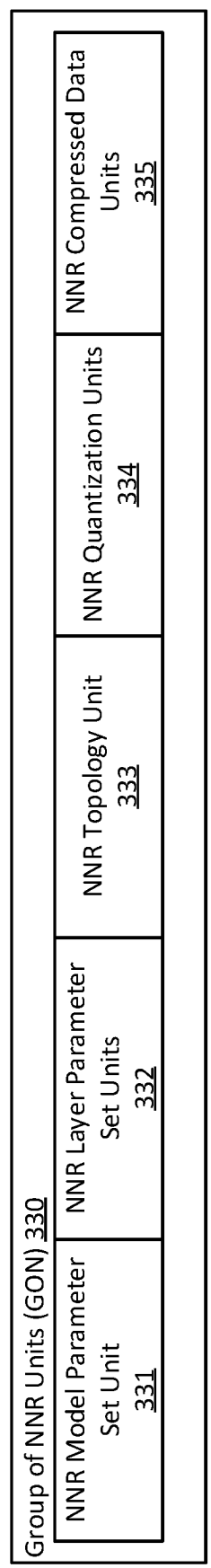
FIG. 6 is a schematic diagram of a group of NNR units (GON) according to embodiments.
Figure 7:
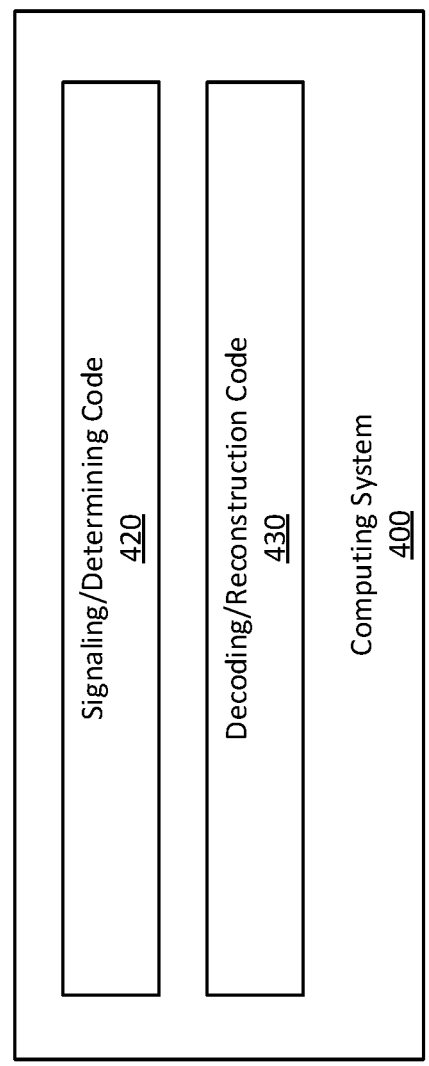
FIG. 7 is a block diagram of a computing system according to an embodiment.

With reference to FIG. 6, embodiments of the present disclosure may be implemented by a computing system 400. The computing system 400 may be configured to receive the NNR bitstream 300 and may comprise at least one processor and memory storing computer instructions. The computer instructions may be configured to cause, when executed by the at least one processor, the at least one processor to perform aspects of the present disclosure.

For example, the computing system 400 may implement a decoder, and the computer instructions may include signaling/determining code 420 and decoding/reconstruction code 430.

The signaling/determining code 420 may cause the at least one processor to signal syntax elements and/or infer values of syntax elements of the various NNR units, and determine characteristics of the NNR units (and the corresponding neural network(s)) based on the syntax elements. The decoding/reconstruction code 430 may be configured to cause the at least one processor to decode coded elements of the NNR bitstream 300 and reconstruct one or more neural networks based on the decoding.

The foregoing disclosure provides illustration and description, but is not intended to be exhaustive or to limit the implementations to the precise form disclosed. Modifications and variations are possible in light of the above disclosure or may be acquired from practice of the implementations. Embodiments of the present disclosure may include any number of the aspects described above, and/or additional aspects.

It will be apparent that systems and/or methods, described herein, may be implemented in different forms of hardware, firmware, or a combination of hardware and software. The actual specialized control hardware or software code used to implement these systems and/or methods is not limiting of the implementations. Thus, it should be understood that software and hardware may be designed to implement the systems and/or methods based on the description herein.

Even though combinations of features are recited in the claims and/or described in the specification, these combinations are not intended to limit the disclosure of possible implementations. In fact, many of these features may be combined in ways not specifically recited in the claims and/or described in the specification. Although each dependent claim listed below may directly depend on only one claim, the disclosure of possible implementations includes each dependent claim in combination with every other claim in the claim set.

No element, act, or instruction used herein may be construed as critical or essential unless explicitly described as such. Also, as used herein, the articles "a" and "an" are intended to include one or more items, and may be used interchangeably with "one or more." Furthermore, as used herein, the term "set" is intended to include one or more items (e.g., related items, unrelated items, a combination of related and unrelated items, etc.), and may be used interchangeably with "one or more." Where only one item is intended, the term "one" or similar language is used. Also, as used herein, the terms "has," "have," "having," or the like are intended to be open-ended terms. Further, the phrase "based on" is intended to mean "based, at least in part, on" unless explicitly stated otherwise.

What is claimed is:

1. A method performed by at least one processor, the method comprising:
receiving a neural network representation (NNR) bitstream including a group of NNR units (GON) that represents an independent neural network with a topology, the GON including an NNR model parameter set unit, an NNR layer parameter set unit, an NNR topology unit, an NNR quantization unit, and an NNR compressed data unit; and
reconstructing the independent neural network with the topology by decoding the GON,
wherein each of the NNR model parameter set unit, the NNR layer parameter set unit, the NNR topology unit, the NNR quantization unit, and the NNR compressed data unit is a respective at least one NNR unit, of the GON, that each includes a header and a payload.

2. The method of claim 1, wherein the GON is included in one or more aggregate NNR units of the NNR bitstream, and the one or more aggregate NNR units each include an aggregate NNR unit header and an aggregate NNR unit payload, the aggregate NNR unit payload including at least a portion of the NNR units of the GON.

3. The method of claim 2, wherein the GON is included in a single aggregate NNR unit.

4. The method of claim 3, wherein the single aggregate NNR unit includes a syntax element that indicates a type of the single aggregate NNR unit as a self-contained NNR aggregate unit.

5. The method of claim 4, wherein the syntax element is included in an aggregate NNR unit header of the single aggregate NNR unit.

6. The method of claim 1, wherein the NNR model parameter set unit includes a syntax element that indicates that NNR units, that refer to the NNR model parameter set unit, are independently decodable.

7. The method of claim 6, wherein the syntax element is included in a header of the NNR model parameter set unit.

8. The method of claim 1, wherein the NNR layer parameter set unit includes a syntax element that indicates that NNR units, that refer to the NNR layer parameter set unit, are independently decodable.

9. The method of claim 8, wherein the syntax element is included in a header of the NNR layer parameter set unit.

10. The method of claim 1, wherein, in the GON, the NNR model parameter set unit is followed by the NNR layer parameter set unit.

11. A system comprising:
at least one processor that is configured to receive a neural network representation (NNR) bitstream including a group of NNR units (GON) that represents an independent neural network with a topology, the GON including an NNR model parameter set unit, an NNR layer parameter set unit, an NNR topology unit, an NNR quantization unit, and an NNR compressed data unit; and
memory storing computer code, the computer code comprising reconstructing code configured to cause the at least one processor to reconstruct the independent neural network with the topology by decoding the GON,
wherein each of the NNR model parameter set unit, the NNR layer parameter set unit, the NNR topology unit, the NNR quantization unit, and the NNR compressed data unit is a respective at least one NNR unit, of the GON, that each includes a header and a payload.

12. The system of claim 11, wherein the GON is included in one or more aggregate NNR units of the NNR bitstream, and the one or more aggregate NNR units each include an aggregate NNR unit header and an aggregate NNR unit payload, the aggregate NNR unit payload including at least a portion of the NNR units of the GON.

13. The system of claim 12, wherein the GON is included in a single aggregate NNR unit.

14. The system of claim 13, wherein the single aggregate NNR unit includes a syntax element that indicates a type of the single aggregate NNR unit as a self-contained NNR aggregate unit, and the computer code comprises determining code that is configured to determine that the single aggregate NNR unit is self-contained based on the syntax element.

15. The system of claim 14, wherein the syntax element is included in an aggregate NNR unit header of the single aggregate NNR unit.

16. The system of claim 11, wherein the NNR model parameter set unit includes a syntax element that indicates that NNR units, that refer to the NNR model parameter set unit, are independently decodable, and the computer code comprises determining code that is configured to determine that the NNR units, that refer to the NNR model parameter set unit, are independently decodable based on the syntax element.

17. The system of claim 16, wherein the syntax element is included in a header of the NNR model parameter set unit.

18. The system of claim 11, wherein the NNR layer parameter set unit includes a syntax element that indicates that NNR units, that refer to the NNR layer parameter set unit, are independently decodable, and the computer code comprises determining code that is configured to determine that the NNR units, that refer to the NNR layer parameter set unit, are independently decodable based on the syntax element.

19. The system of claim 18, wherein the syntax element is included in a header of the NNR layer parameter set unit.

20. A non-transitory computer-readable medium storing computer instructions that, when executed by at least one processor that receives a neural network representation (NNR) bitstream including a group of NNR units (GON) that represents an independent neural network with a topology, cause the at least one processor to:
reconstruct the independent neural network with the topology by decoding the GON,
wherein the GON comprises an NNR model parameter set unit, an NNR layer parameter set unit, an NNR topology unit, an NNR quantization unit, and an NNR compressed data unit,
wherein each of the NNR model parameter set unit, the NNR layer parameter set unit, the NNR topology unit, the NNR quantization unit, and the NNR compressed data unit is a respective at least one NNR unit, of the GON, that each includes a header and a payload.

* * * * *